US012805029B2

(12) United States Patent
Yun et al.

(10) Patent No.: US 12,805,029 B2
(45) Date of Patent: Nov. 17, 2026

(54) TANDEM SOLAR CELL UPPER CELL AND MANUFACTURING METHOD THEREOF

(71) Applicant: Korea Institute of Energy Technology, Naju-si (KR)

(72) Inventors: Jae Ho Yun, Seoul (KR); Jae Chang Yang, Changwon-si (KR)

(73) Assignee: KOREA INSTITUTE OF ENERGY TECHNOLOGY, Naju-si (KR)

( * ) Notice: Subject to any disclaimer, the term of this patent is extended or adjusted under 35 U.S.C. 154(b) by 0 days.

(21) Appl. No.: 19/280,110

(22) Filed: Jul. 25, 2025

(65) Prior Publication Data

US 2026/0033014 A1 Jan. 29, 2026

(30) Foreign Application Priority Data

Jul. 25, 2024 (KR) ........................ 10-2024-0098550

(51) Int. Cl.

*H10F 10/19* (2025.01)
*H10F 10/161* (2025.01)
*H10F 19/40* (2025.01)
*H10F 71/00* (2025.01)
*H10F 77/123* (2025.01)

(52) U.S. Cl.

CPC ........... *H10F 10/19* (2025.01); *H10F 10/161* (2025.01); *H10F 19/40* (2025.01); *H10F 71/139* (2025.01); *H10F 77/123* (2025.01)

(58) Field of Classification Search

None

See application file for complete search history.

(56) References Cited

U.S. PATENT DOCUMENTS

2005/0056312 A1* 3/2005 Young .................... H10F 10/167 136/258
2008/0190479 A1* 8/2008 Hsieh .................... H10F 10/161 136/246
2025/0294916 A1* 9/2025 Shibasaki .............. H10F 19/40

FOREIGN PATENT DOCUMENTS

KR 101395028 B1 5/2014

OTHER PUBLICATIONS

Yoshio et al., 2024 IEEE 52nd Photovoltaic Specialist Conference (PVSC), Jun. 9, 2024, 0149-0151. (Year: 2024).*
Wee et al., Scientific Reports, 5:16272 (2015). (Year: 2015).*
A. Norazlina et al., "Fabrication and Characterization of p-Cu2O on n-TiO2 Layer by Electrodeposition Method for Heterojunction Solar Cells Development," Journal of Human, Earth and Future, Dec. 2021, pp. 334-344, Vo. 2, No. 4.
Korean Office Action for KR Application No. 10-2024-0098550 mailed on Jan. 20, 2026, citing the above reference(s).

* cited by examiner

*Primary Examiner* — Eli S Mekhlin

(74) *Attorney, Agent, or Firm* — CANTOR COLBURN LLP

(57) ABSTRACT

An exemplary embodiment of the present disclosure provides an upper cell of a tandem solar cell, including: a lower transparent electrode disposed on a transparent substrate; an epitaxial $Cu_2O$ light-absorbing layer disposed on the lower transparent electrode; an N-type oxide layer disposed on the epitaxial $Cu_2O$ light-absorbing layer; an upper transparent electrode disposed on the N-type oxide layer; and a metal grid electrode disposed on the transparent electrode, wherein the epitaxial $Cu_2O$ light-absorbing layer has a single crystalline structure.

6 Claims, 5 Drawing Sheets

TANDEM SOLAR CELL UPPER CELL AND MANUFACTURING METHOD THEREOF

CROSS-REFERENCE TO RELATED APPLICATION

This application claims priority to Korean Patent Application No. 10-2024-0098550, filed on Jul. 25, 2024, and all the benefits accruing therefrom under 35 U.S.C. § 119, the contents of which in its entirety are herein incorporated by reference.

BACKGROUND

1. Field

The present disclosure relates to a tandem solar cell, and more specifically, to an upper cell of a tandem solar cell and a method for manufacturing the same.

2. Description of the Related Art

Currently, climate change and energy depletion are emerging as urgent problems to be solved all over the world. The use of solar energy is one of the key technologies to solve such problems, and solar energy is expected to play an important role in future energy resources as an eco-friendly energy resource.

However, conventional silicon-based solar cells for using such solar energy have a problem of poor light energy conversion efficiency because silicon solar cells can absorb only a part of the solar light spectrum.

A tandem solar cell, which is a solar cell to solve such a problem, is a solar cell that can absorb a broader range of light spectrum in a larger amount by stacking two or more semiconductor materials in layers and convert it into electrical energy. In general, two materials with different absorption spectra are used to maximize the conversion efficiency of solar energy.

However, although such a tandem solar cell broadens the absorption spectrum of solar energy, it still shows regrettable energy conversion efficiency, and thus there is a need for new research to further improve the conversion efficiency of solar energy.

REFERENCES

Patent Documents (Patent Document 1) Korean patent publication No. 10-1395028

SUMMARY

The technical problem of the present disclosure is to solve the above-mentioned problems of the related art, and the present disclosure is directed to providing an upper cell of a tandem solar cell having improved solar energy conversion efficiency.

The present disclosure is also directed to providing a method for manufacturing an upper cell of a tandem solar cell.

The technical problems of the present disclosure are not limited to the above-mentioned technical problem, and the technical problems not mentioned may be clearly understood by those skilled in the art from the present specification and attached drawings.

In one aspect, there is provided an upper cell of a tandem solar cell.

An exemplary embodiment of the present disclosure provides an upper cell of a tandem solar cell, including: a lower transparent electrode disposed on a transparent substrate; an epitaxial $Cu_2O$ light-absorbing layer disposed on the lower transparent electrode; an N-type oxide layer disposed on the epitaxial $Cu_2O$ light-absorbing layer; an upper transparent electrode disposed on the N-type oxide layer; and a metal grid electrode disposed on the transparent electrode, wherein the epitaxial $Cu_2O$ light-absorbing layer has a single crystalline structure.

According to an exemplary embodiment of the present disclosure, the N-type oxide layer may include: an electron transport layer; and a conductive oxide layer disposed on the electron transport layer.

According to an exemplary embodiment of the present disclosure, the lower transparent electrode may include at least one selected from the group consisting of indium tin oxide (ITO), antimony tin oxide (ATO) and antimony zinc oxide (AZO).

According to an exemplary embodiment of the present disclosure, the upper transparent electrode may include at least one selected from the group consisting of antimony zinc oxide (AZO) and indium tin oxide (ITO).

According to an exemplary embodiment of the present disclosure, the electron transport layer may include at least one selected from the group consisting of $Ga_2O_3$ and $TiO_2$.

According to an exemplary embodiment of the present disclosure, the conductive oxide layer may include at least one selected from the group consisting of zinc tin oxide (ZTO) and $Zn_{1-x}Ge_x$—O.

According to an exemplary embodiment of the present disclosure, the epitaxial $Cu_2O$ light-absorbing layer may have a thickness of 1-10 μm.

In another aspect, there is provided a method for manufacturing an upper cell of a tandem solar cell.

An exemplary embodiment of the present disclosure provides a method for manufacturing an upper cell of a tandem solar cell, including the steps of: stacking a single crystalline epitaxial $Cu_2O$ light-absorbing layer on a single crystalline silicon substrate; stacking a lower transparent electrode and transparent substrate successively on the single crystalline epitaxial $Cu_2O$ light-absorbing layer; removing the single crystalline silicon substrate through etching; stacking an N-type oxide layer, including an electron transport layer and a conductive oxide layer disposed on the electron transport layer, on the single crystalline epitaxial $Cu_2O$ light-absorbing layer of the surface from which the single crystalline silicon substrate is removed; and stacking an upper transparent electrode and a metal grid electrode successively on the N-type oxide layer.

According to an exemplary embodiment of the present disclosure, the step of stacking a single crystalline epitaxial $Cu_2O$ light-absorbing layer may include introducing the single crystalline silicon substrate into an aqueous solution containing Cu(II) and lactate ions to perform electrodeposition and carrying out drying to form the single crystalline epitaxial $Cu_2O$ light-absorbing layer.

According to an exemplary embodiment of the present disclosure, the aqueous solution may have a Cu(II) ion concentration of 0.1-1 M.

According to an exemplary embodiment of the present disclosure, the aqueous solution may have a lactate ion concentration of 1-5 M.

According to an exemplary embodiment of the present disclosure, the aqueous solution may have a ratio of lactate ions based on Cu(II) ions of 1:1 to 1:50.

According to an exemplary embodiment of the present disclosure, the epitaxial $Cu_2O$ light-absorbing layer may have a thickness of 1-10 μm.

In still another aspect, the present disclosure provides a tandem solar cell.

An exemplary embodiment of the present disclosure provides a tandem solar cell including: the above-described upper cell of a tandem solar cell; and a lower cell of a tandem solar cell, disposed below the upper cell.

The upper cell of a tandem solar cell according to an exemplary embodiment of the present disclosure is an upper cell of a solar cell of a high light energy band including a single crystalline $Cu_2O$ light-absorbing layer and allows a high open voltage and fill factor, and thus can provide improved energy conversion efficiency.

The effects of the present disclosure are not limited to the above-described effects, and should be understood to include all effects deducible from the constitution of the present disclosure described in the detailed description or the claims of the present disclosure.

DETAILED DESCRIPTION

Figure 1:
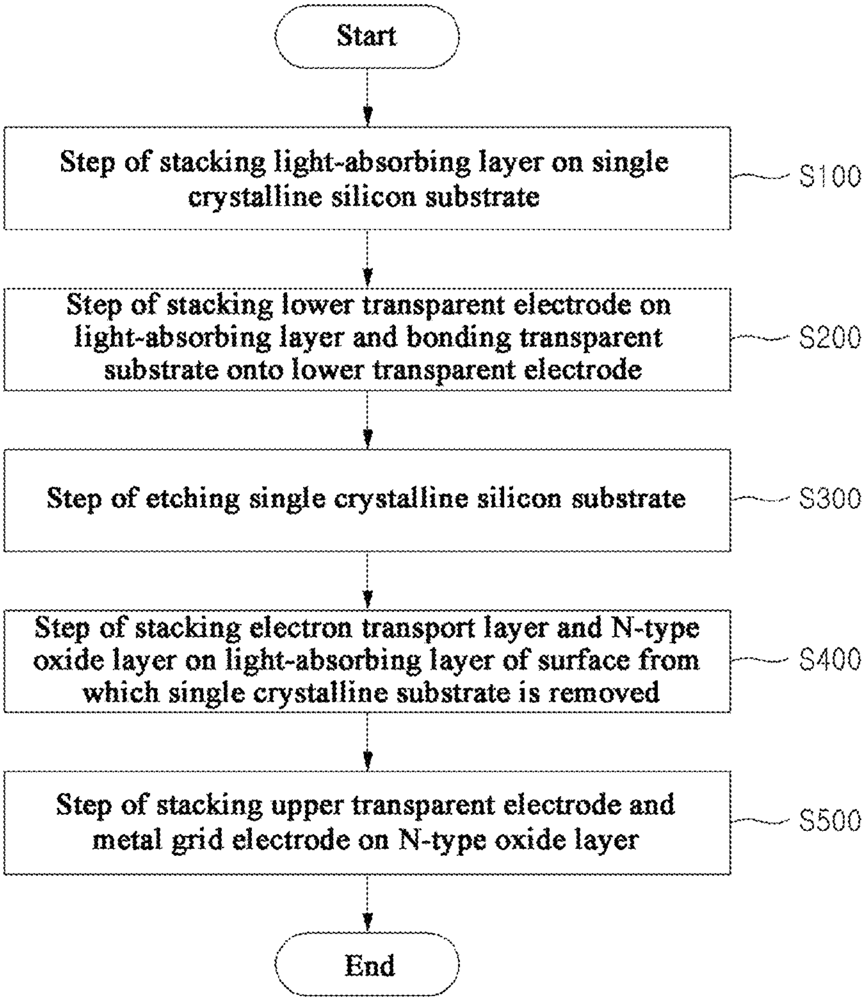
FIG. 1 is a flow chart illustrating the steps of the method for manufacturing an upper cell of a tandem solar cell according to an exemplary embodiment of the present disclosure.

Hereinafter, the present disclosure will be explained with reference to the accompanying drawings. However, the present disclosure may be implemented in various different forms, and thus is not limited to the embodiments described hereinafter. In addition, parts unrelated to the description were omitted in the drawings in order to clearly explain the present disclosure, and similar drawing numerals were used for similar parts throughout the specification.

Throughout the specification, when a part is "linked (connected, contacted, bound)" with another part, it includes not only "directly linked" but also "indirectly linked" with another member interposed therebetween. Also, when a part "includes" a constitutional element, this means that it may further have other constitutional elements, rather than excluding other constitutional elements, unless otherwise stated.

The terms used herein are provided only to describe specific embodiments and are not intended to limit the present disclosure. Singular expressions include plural expressions, unless the context clearly indicates otherwise. In the present specification, terms such as "including" or "having" are intended to specify that there is a feature, number, step, operation, constitutional element, part or a combination thereof described in the specification, and should not be understood as excluding the existence or the possibility of addition of one or more other features, numbers, steps, operations, constitutional elements, parts or combinations thereof.

Hereinafter, exemplary embodiments of the present disclosure will be explained in detail with reference to the accompanying drawings.

In the case of conventional tandem solar cells, they have broadened the absorption spectrum of solar energy, but they could not be free from the problem of low energy conversion efficiency.

To solve the above-mentioned problem, the present disclosure is directed to providing an upper cell of a tandem solar cell using a single crystalline light-absorbing layer, and a method for manufacturing the same.

Hereinafter, the present disclosure will be explained with reference to the accompanying drawings. For reference, the drawings may be partially exaggerated to describe features of the present disclosure. In this case, it is preferred to interpret in light of the purpose of the present specification.

First, an upper cell of a tandem solar cell according to an exemplary embodiment of the present disclosure will be explained.

The upper cell of a tandem solar cell according to an exemplary embodiment of the present disclosure includes: a lower transparent electrode disposed on a transparent substrate; an epitaxial $Cu_2O$ light-absorbing layer disposed on the lower transparent electrode; an N-type oxide layer disposed on the epitaxial $Cu_2O$ light-absorbing layer; an upper transparent electrode disposed on the N-type oxide layer; and a metal grid electrode disposed on the transparent electrode, wherein the epitaxial $Cu_2O$ light-absorbing layer has a single crystalline structure.

A tandem solar cell has a structure that looks like two solar cells are superimposed, and in general, the upper cell uses a material (e.g. perovskite) absorbing light with a short wavelength and the lower cell uses a material (e.g. silicon) absorbing light with a long wavelength. By virtue of such a combination of materials having different properties, the tandem solar cell absorbs a broader range of solar energy absorption spectrum of a solar cell and accomplishes higher energy conversion efficiency.

Herein, the tandem solar cell generally has a constitution of 2-terminal tandem solar cell (solar cell including a lower electrode and upper electrode). When each of the upper cell and lower cell has a lower electrode and upper electrode, the tandem solar cell may be referred to as a 4-terminal tandem solar cell.

Herein, the upper cell of a tandem solar cell according to the present disclosure may be used as a single solar cell, and preferably as an upper cell of a tandem solar cell, and more preferably as an upper cell of a 4-terminal tandem solar cell.

Hereinafter, the structure of the upper cell of a tandem solar cell according to the present disclosure will be explained in more detail.

The Upper Cell of a Tandem Solar Cell According to the Present Disclosure May Include a Lower Transparent Electrode Disposed on a Transparent Substrate.

Herein, the transparent substrate is used for physically supporting a device, and any substrate may be used with no particular limitation as long as it is transparent and can support a device. Preferably, a glass substrate may be used.

In addition, the lower transparent electrode disposed on the transparent substrate is not particularly limited, as long as it includes a material that can be used as a lower transparent electrode of a solar cell. However, the lower transparent electrode may preferably include at least one selected from the group consisting of indium tin oxide (ITO), antimony tin oxide (ATO) and antimony zinc oxide (AZO).

The Upper Cell of a Tandem Solar Cell According to the Present Disclosure May Include an Epitaxial $Cu_2O$ Light-Absorbing Layer Disposed on the Lower Transparent Electrode.

In the case of a conventional tandem solar cell, and particularly, in the case of a 4-terminal tandem solar cell, its light-absorbing layer has a polycrystalline structure. Accordingly, when using a $Cu_2O$ light-absorbing layer as a light-absorbing layer for manufacturing a solar cell of a high energy band, a light-absorbing layer having a polycrystalline structure has been used.

Herein, the light-absorbing layer of a solar cell functions to absorb solar light, to generate an electron-hole pair and to isolate electrons, thereby generating current.

Herein, the light-absorbing layer having a polycrystalline structure has a slightly low open voltage and fill factor. In a solar cell, the open voltage and fill factor represent important indicators in evaluating the performance of the solar cell.

The open voltage refers to the maximum voltage generated between a positive electrode and a negative electrode in a state where no external load is connected. As the open voltage increases, the maximum electric power that can be generated by a solar cell also increases.

In addition, in the case of a fill factor, it is an indicator representing a ratio of the maximum output of a solar cell to the theoretical maximum output and represents how efficiently an electron-hole pair generated in a light-absorbing layer is converted and output into current. As the fill factor increases, actual electric power generated by a solar cell approaches the theoretical maximum output.

Therefore, it is important to improve the open voltage and fill factor of a light-absorbing layer contained in a solar cell. For this purpose, according to the present disclosure, a $Cu_2O$ light-absorbing layer having a single crystalline structure is used as a light-absorbing layer.

Herein, in principle, when $Cu_2O$ of the light-absorbing layer forms a single crystalline structure, the defects of the light-absorbing layer are reduced, and the light-absorbing layer of a solar cell having a single crystalline structure shows a regular atom arrangement and constant alignment direction and causes no jamming in electron transport, resulting in a decrease in recombination of positive charges with negative charges. Based on this principle, the open voltage and fill factor of the light-absorbing layer can be improved.

Herein, since the thickness of the light-absorbing layer may cause a change in performance of the resultant upper cell of a tandem solar cell, there is a preferred thickness range. In this context, the epitaxial $Cu_2O$ light-absorbing layer may have a thickness of 1-10 μm.

Herein, when the epitaxial $Cu_2O$ light-absorbing layer has a thickness of less than 1 μm, the upper cell of a tandem solar cell may show a problem of insufficient light absorption. When the epitaxial $Cu_2O$ light-absorbing layer has a thickness of larger than 10 μm, there may be a problem in that light cannot be transported sufficiently to the lower cell of a tandem solar cell.

Therefore, the epitaxial $Cu_2O$ light-absorbing layer may have a thickness of 1-10 μm. Preferably, the epitaxial $Cu_2O$ light-absorbing layer may have a thickness of 2-6 μm.

The Upper Cell of a Tandem Solar Cell According to the Present Disclosure May Include an N-Type Oxide Layer Disposed on the Epitaxial $Cu_2O$ Light-Absorbing Layer.

The N-type oxide layer refers to an oxide layer of N-type and may include an electron transport layer and a conductive oxide layer disposed on the electron transport layer.

Accordingly, both the electron transport layer and the conductive oxide layer may exhibit N-type.

Herein, the electron transport layer functions to transport the electrons generated in the light-absorbing layer of a solar cell efficiently toward a negative electrode.

In addition, the conductive oxide layer functions to collect the electrons to generate electric power.

Herein, any material may be used for the electron transport layer with no particular limitation as long as it is one used conventionally for a solar cell, but preferably, the electron transport layer may include at least one selected from the group consisting of $Ga_2O_3$ and $TiO_2$.

Further, any material may be used for the conductive oxide layer with no particular limitation as long as it is one used conventionally for a solar cell, but preferably, the conductive oxide layer may include at least one selected from the group consisting of zinc tin oxide (ZTO) and $Zn_{1-x}Ge_x$—O (wherein x is a number satisfying $0<x<1$).

The Upper Cell of a Tandem Solar Cell According to the Present Disclosure May Include an Upper Transparent Electrode Disposed on the N-Type Oxide Layer.

Any transparent electrode may be used with no particular limitation as long as it is one used conventionally for a solar cell, but preferably, the upper transparent electrode may include at least one selected from the group consisting of antimony zinc oxide (AZO) and indium tin oxide (ITO).

The Upper Cell of a Tandem Solar Cell According to the Present Disclosure May Include a Metal Grid Electrode Disposed on the Upper Transparent Electrode.

Any conventional metal electrode may be used for the metal grid electrode with no particular limitation, but preferably, the metal grid electrode may include Ag, Al or Cu.

Hereinafter, a method for manufacturing an upper cell of a tandem solar cell according to an exemplary embodiment of the present disclosure will be explained.

FIG. 1 is a flow chart illustrating the steps of the method for manufacturing an upper cell of a tandem solar cell according to an exemplary embodiment of the present disclosure.

Referring to FIG. 1, the method for manufacturing an upper cell of a tandem solar cell according to an exemplary embodiment of the present disclosure may include the steps of: (S100) stacking a single crystalline epitaxial $Cu_2O$ light-absorbing layer on a single crystalline silicon substrate; (S200) stacking a lower transparent electrode on the single crystalline epitaxial $Cu_2O$ light-absorbing layer and then bonding a transparent substrate onto the lower transparent electrode; (S300) removing the single crystalline silicon substrate through etching; (S400) stacking an N-type oxide layer, including an electron transport layer and a conductive oxide layer disposed on the electron transport layer, on the single crystalline epitaxial $Cu_2O$ light-absorbing layer of the surface from which the single crystalline silicon substrate is removed; and (S500) stacking an upper transparent electrode and a metal grid electrode successively on the N-type oxide layer.

As the First Step, the Method May Include a Step of Stacking a Single Crystalline Epitaxial $Cu_2O$ Light-Absorbing Layer on a Single Crystalline Silicon Substrate (S100).

The reason why the single crystalline silicon substrate is used is for growing a single crystalline structure of an epitaxial $Cu_2O$ light-absorbing layer to be formed on the single crystalline silicon substrate. For this purpose, it is important to prepare a single crystalline silicon substrate.

Herein, since the single crystalline silicon substrate is removed through etching in the subsequent step, any silicon substrate having a single crystalline structure may be used with no particular limitation in thickness.

Meanwhile, a specific aqueous solution may be prepared and applied onto the single crystalline silicon substrate in order to stack the single crystalline epitaxial $Cu_2O$ light-absorbing layer on the single crystalline silicon substrate.

Particularly, the step of stacking a single crystalline epitaxial $Cu_2O$ light-absorbing layer may include introducing the single crystalline silicon substrate into an aqueous solution containing Cu(II) and lactate ions to perform electrodeposition and carrying out drying to form the single crystalline epitaxial $Cu_2O$ light-absorbing layer.

Herein, when the aqueous solution containing Cu(II) and lactate ions is applied onto the single crystalline silicon substrate and dried, a single crystalline epitaxial $Cu_2O$ light-absorbing layer is formed. This is because the single crystalline silicon substrate functions as seeds for the growth of single crystals of a $Cu_2O$ thin film.

Meanwhile, the aqueous solution may have a Cu(II) ion concentration of 0.1-1 M. The reason is as follows. When the aqueous solution has a Cu(II) ion concentration of less than 0.1 M, a problem may be generated in that sufficient Cu cannot be supplied. When the aqueous solution has a Cu(II) ion concentration of higher than 1 M, a problem may be generated in that a thin film having desired quality cannot be formed due to excessive Cu supply.

In addition, the aqueous solution may have a lactate ion concentration of 1-5 M.

Herein, when the lactate ion concentration of the aqueous solution does not fall within a range of 1-5 M, a problem may be generated in that an optimized amount of oxygen cannot be supplied. Therefore, the above-defined range of concentration is preferred.

According to an exemplary embodiment of the present disclosure, the aqueous solution may have a ratio of lactate ions based on Cu(II) ions of 1:1 to 1:50.

Herein, when the ratio of lactate ions based on Cu(II) ions of the aqueous solution does not fall within the above-defined range, a problem may be generated in that the light-absorbing layer cannot satisfy a compositional ratio of Cu (copper) and oxygen (O) optimized for high energy conversion efficiency.

Meanwhile, the $Cu_2O$ thin film as a light-absorbing layer may be stacked by introducing the single crystalline silicon wafer to the aqueous solution and using an electrodeposition process, or by using a sputtering device instead of the aqueous solution.

Herein, the epitaxial $Cu_2O$ light-absorbing layer may have a thickness of 1-10 μm.

As the Second Step, the Method May Include a Step of Stacking a Lower Transparent Electrode on the Single Crystalline Epitaxial $Cu_2O$ Light-Absorbing Layer and then Bonding a Transparent Substrate onto the Lower Transparent Electrode (S200).

Herein, any material may be used for the lower transparent electrode with no particular limitation as long as it is one that can be used for a lower transparent electrode of a solar cell, but preferably, the lower transparent electrode may include at least one selected from the group consisting of indium tin oxide (ITO), antimony tin oxide (ATO) and antimony zinc oxide (AZO).

In addition, the transparent substrate is used for physically supporting a device, and any transparent substrate may be used with no particular limitation as long as it is transparent and can support the device, a glass substrate being used preferably.

Figure 2:
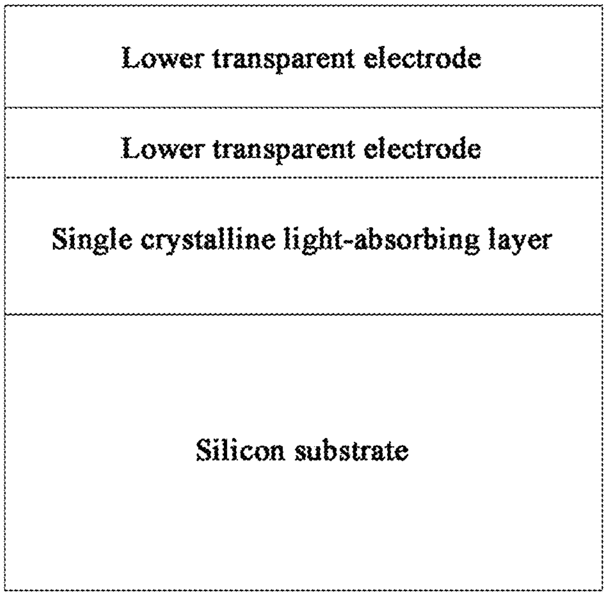
FIG. 2 is a schematic view illustrating a device in which a single crystalline epitaxial $Cu_2O$ light-absorbing layer and a lower transparent electrode are stacked on a single crystalline silicon substrate, in the process for manufacturing an upper cell of a tandem solar cell according to an exemplary embodiment of the present disclosure.

FIG. 2 is a schematic view illustrating a device in which a single crystalline epitaxial $Cu_2O$ light-absorbing layer and a lower transparent electrode are stacked on a single crystalline silicon substrate, in the process for manufacturing an upper cell of a tandem solar cell according to an exemplary embodiment of the present disclosure.

Figure 3:
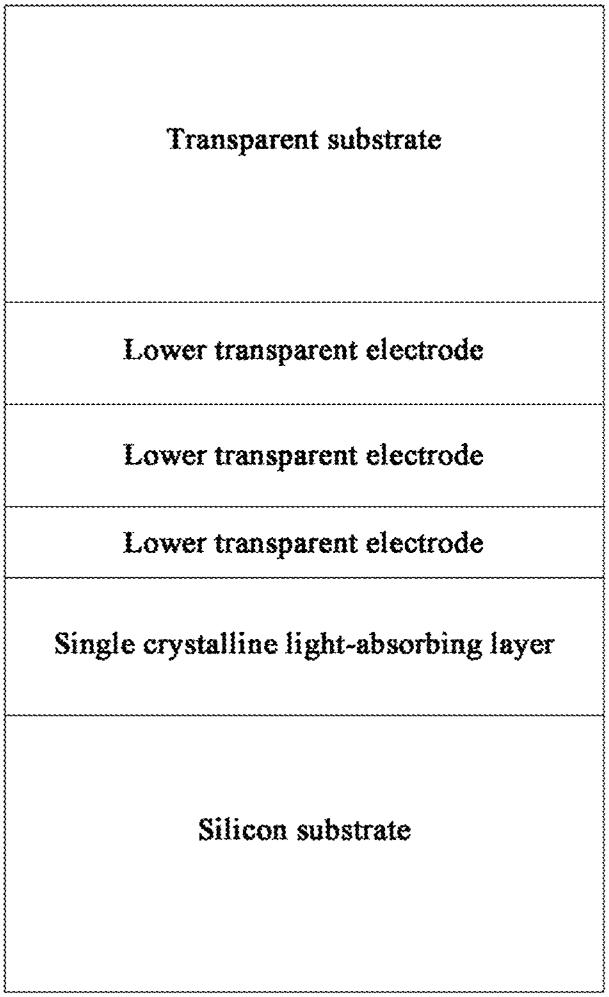
FIG. 3 is a schematic view illustrating a device including a glass substrate bonded in advance to support the device even when removing a single crystalline silicon substrate, in the process for manufacturing an upper cell of a tandem solar cell according to an exemplary embodiment of the present disclosure.
Figure 4:
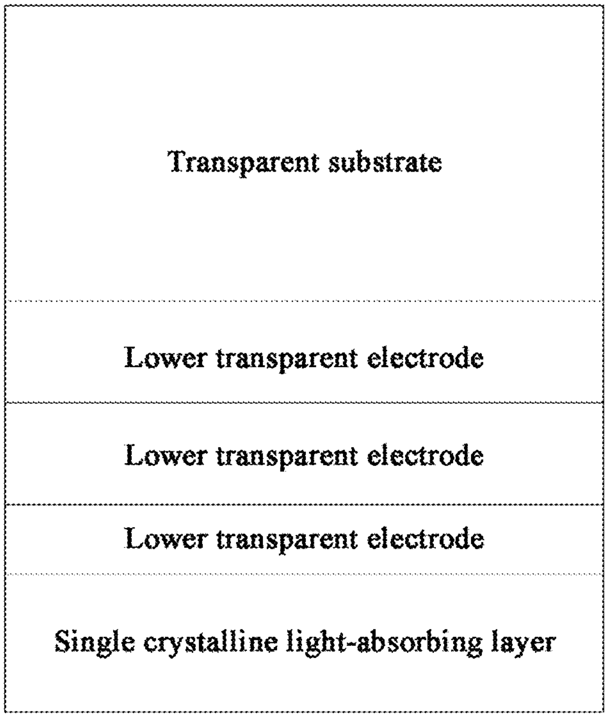
FIG. 4 is a schematic view illustrating a device from which a silicon crystalline substrate is removed, in the process for manufacturing an upper cell of a tandem solar cell according to an exemplary embodiment of the present disclosure.

FIG. 3 is a schematic view illustrating a device including a glass substrate bonded in advance to support the device even when removing a single crystalline silicon substrate, in the process for manufacturing an upper cell of a tandem solar cell according to an exemplary embodiment of the present disclosure.

Referring to FIG. 2 and FIG. 3, it can be seen that the single crystalline light-absorbing layer is formed on the silicon substrate, the lower transparent electrode is formed on the single crystalline light-absorbing layer, and the transparent substrate is formed on the lower transparent electrode.

As the Third Step, the Method May Include a Step of Removing the Single Crystalline Silicon Substrate Through Etching (S300).

Since the single crystalline silicon substrate is one used for forming the single crystalline epitaxial $Cu_2O$ light-absorbing layer, it is removed through an etching process after the single crystalline epitaxial $Cu_2O$ light-absorbing layer is formed.

Herein, a mechanical polishing process, etching process using a chemical solution or a dry etching process may be carried out to etch the single crystalline silicon substrate.

As the Fourth Step, the Method May Include a Step of Stacking an N-Type Oxide Layer, Including an Electron Transport Layer and a Conductive Oxide Layer Disposed on the Electron Transport Layer, on the Single Crystalline Epitaxial $Cu_2O$ Light-Absorbing Layer of the Surface from which the Single Crystalline Silicon Substrate is Removed (S400).

Herein, an atomic layer deposition (ALD) or sputtering process may be used to perform stacking of the N-type oxide layer, including an electron transport layer and a conductive oxide layer disposed on the electron transport layer, on the single crystalline epitaxial $Cu_2O$ light-absorbing layer of the surface from which the single crystalline silicon substrate is removed.

Herein, any material may be used for the electron transport layer with no particular limitation as long as it is one used conventionally for a solar cell, but preferably, the electron transport layer may include at least one selected from the group consisting of $Ga_2O_3$ and $TiO_2$.

Further, any material may be used for the conductive oxide layer with no particular limitation as long as it is one used conventionally for a solar cell, but preferably, the conductive oxide layer may include at least one selected from the group consisting of zinc tin oxide (ZTO) and $Zn_{1-x}Ge_x$—O (wherein x is a number satisfying 0<x<1).

As the Final Step, the Method May Include a Step of Stacking an Upper Transparent Electrode and a Metal Grid Electrode Successively on the N-Type Oxide Layer (S500).

Herein, a sputtering process or a screen printing process is used in order to stack the upper transparent electrode and a metal grid electrode successively.

In addition, any transparent electrode may be used with no particular limitation as long as it is one used conventionally for a solar cell, but preferably, the upper transparent electrode may include at least one selected from the group consisting of antimony zinc oxide (AZO) and indium tin oxide (ITO).

In addition, a conventional metal electrode may be used for the metal grid electrode with no particular limitation, but preferably, the metal grid electrode may include Ag, Al or Cu.

Figure 5:
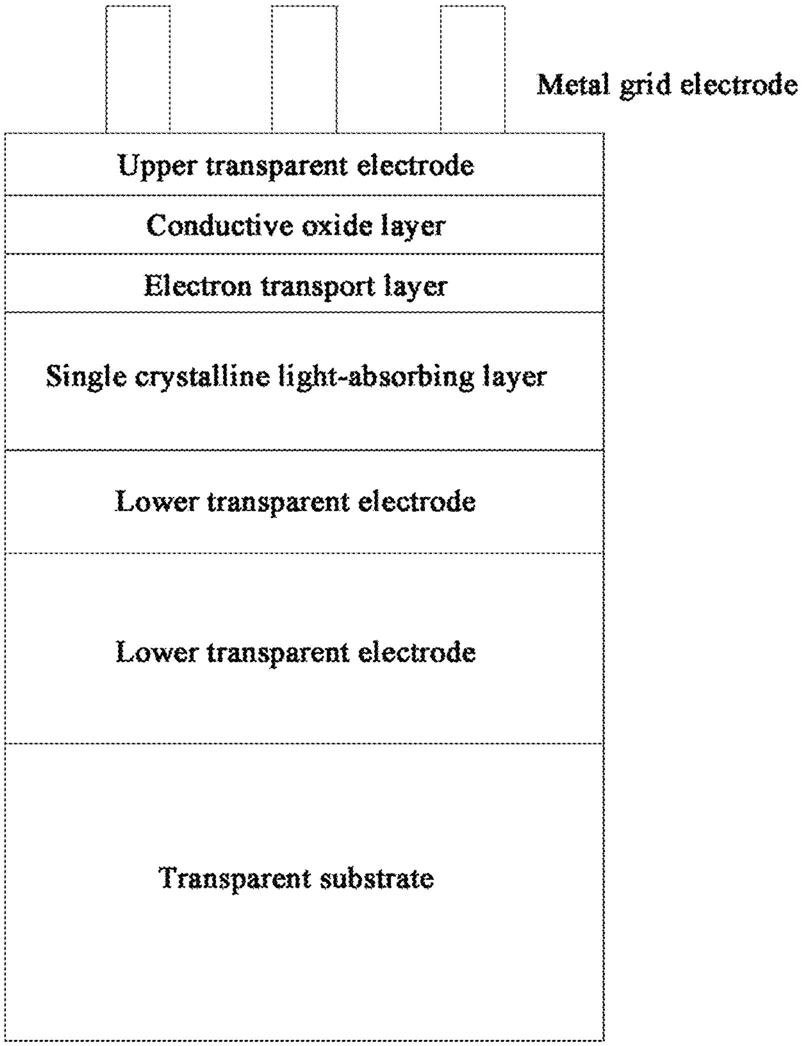
FIG. 5 is a schematic view illustrating a device including an N-type oxide layer, transparent electrode and a metal grid layer stacked successively on a single crystalline epitaxial $Cu_2O$ light-absorbing layer of the surface from which a single crystalline silicon substrate is removed, in the process for manufacturing an upper cell of a tandem solar cell according to an exemplary embodiment of the present disclosure.

FIG. 5 is a schematic view illustrating a device including an N-type oxide layer, a transparent electrode and a metal grid layer stacked successively on a single crystalline epitaxial $Cu_2O$ light-absorbing layer of the surface from which a single crystalline silicon substrate is removed, in the process for manufacturing an upper cell of a tandem solar cell according to an exemplary embodiment of the present disclosure.

Referring to FIG. 5, it can be seen that an upper cell of a 4-terminal tandem solar cell is obtained through the method for manufacturing an upper cell of a tandem solar cell according to an exemplary embodiment of the present disclosure.

Hereinafter, the present disclosure will be described in more detail with reference to Examples, Comparative Examples and Test Examples. These Examples, Comparative Examples and Test Examples are for illustrative purposes only, and the scope of the present disclosure is not limited by these Examples, Comparative Examples and Test Examples.

Example

Manufacture of Upper Cell of 4-Terminal Tandem Solar Cell

For manufacturing an upper cell of a tandem solar cell according to an exemplary embodiment of the present disclosure, first, a silicon wafer as a single crystalline silicon wafer was introduced into an aqueous solution containing Cu(II) and lactate ions, and electrodeposition was carried out to stack a single crystalline epitaxial $Cu_2O$ light-absorbing layer on the single crystalline silicon wafer.

Herein, the aqueous solution had a Cu(II) ion concentration of 0.4 M and a lactate ion concentration of 3 M.

In addition, drying was carried out at a temperature of 100° C. for 30 minutes to dry the aqueous solution remaining on the surface of silicon.

Next, for forming a transparent electrode to be used as a rear electrode on the single crystalline epitaxial $Cu_2O$ light-absorbing layer, an ATO (antimony tin oxide) rear electrode was stacked to a thickness of 200 nm by using a sputtering process.

Then, an ITO (indium tin oxide) rear electrode was stacked to a thickness of 200 nm on the ATO rear electrode.

After that, a glass substrate having a transparent electrode made of ITO was bonded onto the rear electrode.

Herein, the glass substrate had a thickness of 1 mm.

Subsequently, a dry or wet etching process was carried out to remove the silicon wafer.

Finally, an atomic layer deposition (ALD), sputtering or screen printing process was carried out to form an N-type layer, a transparent electrode and a metal grid electrode successively on the epitaxial $Cu_2O$ light-absorbing layer of the surface opposite to the glass substrate.

In this manner, an upper cell of a 4-terminal tandem solar cell was obtained according to an exemplary embodiment of the present disclosure.

The foregoing description of the present disclosure is for illustrative purposes only, and those skilled in the art will understand that it may be easily transformed into other specific forms without changing the technical idea or essential features of the present disclosure. Therefore, it should be understood that the embodiments described above are exemplary and not limited in all aspects. For example, each constitutional element described in a single form may be implemented separately, or similarly, constitutional elements described as separated may be implemented in a combined form.

The scope of the present disclosure should be defined by the claims described hereinafter, and all changes or modifications derived from the meaning and scope of the claims and the equivalent concept thereof should be interpreted as being included in the scope of the present disclosure.

What is claimed is:

1. A method for manufacturing an upper cell of a tandem solar cell, comprising the steps of:

stacking a single crystalline epitaxial $Cu_2O$ light-absorbing layer on a single crystalline silicon substrate;

stacking a lower transparent electrode on the single crystalline epitaxial $Cu_2O$ light-absorbing layer and then bonding a transparent substrate onto the lower transparent electrode;

removing the single crystalline silicon substrate through etching;

stacking an N-type oxide layer, comprising an electron transport layer and a conductive oxide layer disposed on the electron transport layer, on the single crystalline epitaxial $Cu_2O$ light-absorbing layer of the surface from which the single crystalline silicon substrate is removed; and stacking an upper transparent electrode and a metal grid electrode successively on the N-type oxide layer.

2. The method for manufacturing an upper cell of a tandem solar cell according to claim 1, wherein the step of stacking a single crystalline epitaxial $Cu_2O$ light-absorbing layer comprises applying the single crystalline silicon substrate onto an aqueous solution containing Cu(II) and lactate ions and carrying out drying to form the single crystalline epitaxial $Cu_2O$ light-absorbing layer.

3. The method for manufacturing an upper cell of a tandem solar cell according to claim 2, wherein the aqueous solution has a Cu(II) ion concentration of 0.1-1 M.

4. The method for manufacturing an upper cell of a tandem solar cell according to claim 2, wherein the aqueous solution has a lactate ion concentration of 1-5 M.

5. The method for manufacturing an upper cell of a tandem solar cell according to claim 2, wherein the aqueous solution has a ratio of lactate ions based on Cu(II) ions of 1:1 to 1:50.

6. The method for manufacturing an upper cell of a tandem solar cell according to claim 1, wherein the epitaxial $Cu_2O$ light-absorbing layer has a thickness of 1-10 μm.

* * * * *